United States Patent
Golubovsky

(10) Patent No.: US 7,713,390 B2
(45) Date of Patent: May 11, 2010

(54) GROUND SHIELD FOR A PVD CHAMBER

(75) Inventor: Edward Golubovsky, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1349 days.

(21) Appl. No.: 11/131,009

(22) Filed: May 16, 2005

(65) Prior Publication Data

US 2006/0254904 A1   Nov. 16, 2006

(51) Int. Cl.
*C23C 14/00* (2006.01)
(52) U.S. Cl. .............. 204/298.11; 204/298.12; 204/298.18; 204/298.19
(58) Field of Classification Search ......... 204/298.11, 204/298.12, 298.18, 298.19
See application file for complete search history.

(56) References Cited

U.S. PATENT DOCUMENTS

| | | | | |
|---|---|---|---|---|
| H1135 H | * | 2/1993 | Schwartz | ............... 399/57 |
| 5,763,851 A | * | 6/1998 | Forster et al. | ......... 219/121.43 |
| 2004/0020759 A1 | * | 2/2004 | Lawson et al. | ........... 204/192.1 |

FOREIGN PATENT DOCUMENTS

JP        05093268 A   *  4/1993

OTHER PUBLICATIONS

Machine Translation of JP-05-093268, published on Apr. 1, 1993 to Ikeda.*

* cited by examiner

*Primary Examiner*—Nam X Nguyen
*Assistant Examiner*—John Brayton
(74) *Attorney, Agent, or Firm*—Patterson and Sheridan LLP

(57) ABSTRACT

Apparatus for processing a substrate in a physical vapor deposition chamber is provided herein. In one embodiment, apparatus for processing a substrate in a physical vapor deposition chamber having a target disposed in a lid assembly and a grounded chamber wall includes a ground frame and a ground shield. The ground frame is configured to be insulatively coupled to the lid assembly and has an electrically conductive lower surface. The ground shield has an electrically conductive wall that is adjustably and electrically coupled to the conductive lower surface of the ground frame. The ground shield is configured to circumscribe the target and has an upper edge configured to provide a gap between the upper edge and a peripheral edge of the target when installed.

23 Claims, 4 Drawing Sheets

GROUND SHIELD FOR A PVD CHAMBER

BACKGROUND OF THE INVENTION

1. Field of the Invention

Embodiments of the present invention generally relate to substrate processing systems. More specifically, the invention relates to a physical vapor deposition chamber of a substrate processing system.

2. Description of the Related Art

Physical vapor deposition (PVD), or sputtering, is one of the most commonly used processes in fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate pedestal disposed within the chamber.

A ground shield may be disposed in the chamber to help define a processing region in a desired region within the chamber with respect to the substrate. The ground shield helps confine the plasma within the processing region. Confining the plasma and the ejected atoms to the processing region helps maintain other components in the chamber free from deposited materials and promotes more efficient use of target materials, as a higher percentage of the ejected atoms are deposited on the substrate.

The ground shield is electrically coupled to the vacuum chamber walls and is electrically isolated from the target. As such, the ground shield is typically attached to the walls, or body, of the vacuum chamber. In addition, a small gap is maintained between the edge of the ground shield and the target to prevent the plasma from forming outside of the processing region. However, it is difficult to align the ground shield and the target to maintain the small gap therebetween, resulting in time consuming set-up and maintenance costs for proper operation of the apparatus. This effect is exacerbated by the use of larger targets, required for processing larger substrates. For example, substrates for use in the manufacture of flat panel displays have grown to about 15,000 cm$^2$ and above. In addition, even larger substrates are envisioned in the future.

Therefore, there is a need in the art for an improved ground shield for use in a PVD chamber.

SUMMARY OF THE INVENTION

Apparatus for processing a substrate in a physical vapor deposition chamber is provided herein. In one embodiment, apparatus for processing a substrate in a physical vapor deposition chamber having a target disposed in a lid assembly and a grounded chamber wall includes a ground frame and a ground shield. The ground frame is configured to be insulatively coupled to the lid assembly and has an electrically conductive lower surface. The ground shield has an electrically conductive wall that is adjustably and electrically coupled to the conductive lower surface of the ground frame. The ground shield is configured to circumscribe the target and has an upper edge configured to provide a gap between the upper edge and a peripheral edge of the target when installed.

In another embodiment, apparatus for processing a substrate includes a chamber having a body and a lid assembly. A target is coupled to the lid assembly. A ground frame is coupled to the lid assembly and electrically insulated from the target. The ground frame has an electrically conductive path to the body. An electrically conductive ground shield is adjustably and electrically coupled to the ground frame. The ground shield circumscribes the target.

In another aspect of the present invention a method for processing a substrate includes adjustably coupling a ground shield to a lid assembly of a processing chamber while the lid assembly is open and then closing the lid assembly. A substrate is placed into the chamber and then a plasma is formed within the chamber. The ground shield may be adjusted with respect to the target to define a gap between an edge of the ground shield and a facing protruding edge of the target. The ground shield may further comprise a plurality of segments and each of the plurality of segments may be individually adjusted with respect to the target to define the gap.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The present invention provides an improved ground shield that may be easily coupled to and aligned with a target for use in a PVD chamber. The ground shield is insulated from the target and coupled to ground when installed in the PVD chamber. The ground shield is easily aligned with the target while the lid is removed from the chamber, thereby reducing set-up time and cost. The improved alignment between the ground shield and the target further improves the uniformity and control of the PVD process. Although PVD chambers having targets of any size may benefit from the ground shield of the present invention, PVD chambers having larger targets may especially benefit due to the increased perimeter of the target, about which the small, uniform gap must be maintained with respect to the ground shield.

Figure 1A:
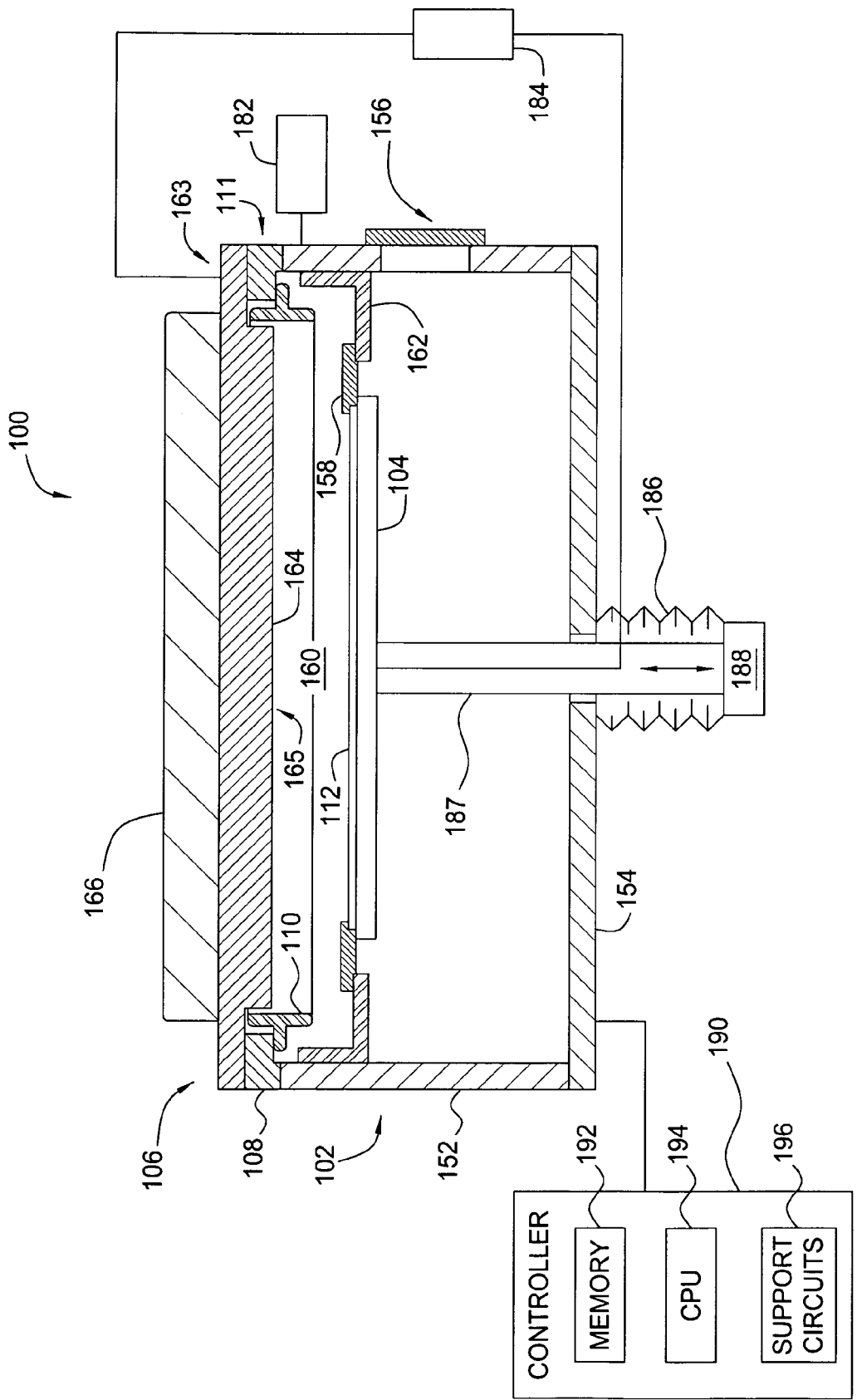
FIG. 1A is a simplified cross-sectional view of a PVD chamber having a ground shield of the present invention.

FIG. 1A depicts a process chamber 100 that includes one embodiment of a ground shield assembly 111 of the present invention. One example of a process chamber 100 that may be adapted to benefit from the invention is a PVD process chamber, available from AKT, Inc., located in Santa Clara, Calif.

The exemplary process chamber 100 includes a chamber body 102 and a lid assembly 106 that define an evacuable process volume 160. The chamber body 102 is typically fabricated from welded stainless steel plates or a unitary block of aluminum. The chamber body 102 generally includes sidewalls 152 and a bottom 154. The sidewalls 152 and/or bottom 154 generally contain a plurality of apertures that include an access port 156 and a pumping port (not shown). Other apertures, such as a shutter disk port (not shown) may also optionally be formed in the sidewalls 152 and or bottom 154 of the chamber body 102. The sealable access port 156 provides for entrance and egress of a substrate 112 to and from the process chamber 100. The pumping port is coupled to a pumping system (also not shown) that evacuates and controls the pressure within the process volume 160.

A substrate support 104 is generally disposed on the bottom 154 of the chamber body 102 and supports the substrate 112 thereupon during processing. The substrate support 104 is typically fabricated from aluminum, stainless steel, ceramic or combinations thereof. A shaft 187 extends through the bottom 154 of the chamber 102 and couples the substrate support 104 to a lift mechanism 188. The lift mechanism 188 is configured to move the substrate support 104 between a lower position and an upper position. The substrate support 104 is depicted in an intermediate position in FIG. 1A. A bellows 186 is typically disposed between the substrate support 104 and the chamber bottom 154 and provides a flexible seal therebetween, thereby maintaining vacuum integrity of the chamber volume 160.

Optionally, a bracket 162 and a shadow frame 158 may be disposed within the chamber body 102. The bracket 162 may be coupled, for example, to the wall 152 of the chamber body 102. The shadow frame 158 is generally configured to confine deposition to a portion of the substrate 112 exposed through the center of the shadow frame 158. When the substrate support 104 is moved to the upper position for processing, an outer edge of the substrate 112 disposed on the substrate support 104 engages the shadow frame 158 and lifts the shadow frame 158 from the bracket 162. Alternatively, shadow frames having other configurations may optionally be utilized as well.

The substrate support 104 is moved into the lower position for loading and unloading a substrate from the substrate support 104. In the lower position, the substrate support 104 is positioned below the shield 162 and the port 156. The substrate 112 may then be removed from or placed into the chamber 100 through the port 156 in the sidewall 152 while clearing the shadow frame 158 and shield 162. Lift pins (not shown) are selectively moved through the substrate support 104 to space the substrate 112 away from the substrate support 104 to facilitate the placement or removal of the substrate 112 by a wafer transfer mechanism disposed exterior to the process chamber 100 such as a single blade robot (not shown).

The lid assembly 106 generally includes a target 164 and the ground shield assembly 111 directly coupled thereto. The target 164 provides material that is deposited on the substrate 112 during the PVD process. The target generally includes a peripheral portion 163 and a central portion 165. The peripheral portion 163 is disposed over the walls 152 of the chamber. The central portion 165 of the target 164 may protrude, or extend in a direction towards the substrate support 104. It is contemplated that other target configurations may be utilized as well. For example, the target may comprise a backing plate having a central portion of a desired material bonded or attached thereto. The target material may also comprise adjacent tiles or segments of material that together form the target. Optionally, the lid assembly 106 may further comprise a magnetron 166, which enhances consumption of the target material during processing.

The target 164 and substrate support 104 are biased relative each other by a power source 184. A gas, such as argon, is supplied to the process volume 160 from a gas source 182 through one or more apertures (not shown), typically formed in the walls 152 of the process chamber 100. A plasma is formed from the gas between the substrate 112 and the target 164. Ions within the plasma are accelerated toward the target 164 and cause material to become dislodged from the target 164. The dislodged material is attracted towards the substrate 112 and deposits a film of material thereon.

The ground shield assembly 111 includes a ground frame 108 and a ground shield 110. The ground shield surrounds the central portion 165 of the target 164 to define a processing region within the process volume 160 and is coupled to the peripheral portion 163 of the target 164 by the ground frame 108. The ground frame 108 electrically insulates the ground shield 110 from the target 164 while providing a ground path to the body 102 of the chamber 100 (typically through the sidewalls 152). One benefit of attaching the ground shield 110 to the lid assembly 106 is that the ground shield 110 and the target 164 may be more easily and accurately aligned prior to placing the lid assembly 106 on the chamber body 102, thereby reducing the time required to align the ground shield 110 with the target 164. Moreover, once the ground shield 110 is attached to the lid assembly 106, the lid assembly 106 may simply be placed on the chamber walls 156 to complete the set up. Thus, the need to align the ground shield and the target after installation, as required in conventional chambers with adjustable target/ground shield arrangements, is eliminated. Moreover, the need for costly precise locating pins and/or parts, as required in conventional chambers that do not have adjustable target/ground shield arrangements, is also eliminated.

The ground shield 110 constrains the plasma within the region circumscribed by the ground shield 110 to ensure that material is only dislodged from the central portion 165 of the target 164. The ground shield 110 may also facilitate depositing the dislodged target material mainly on the substrate 112. This maximizes the efficient use of the target material as well as protects other regions of the chamber body 102 from deposition or attack from the dislodged species or the from the plasma, thereby enhancing chamber longevity and reducing the downtime and cost required to clean or otherwise maintain the chamber. Another benefit derived from this aspect of the invention is the reduction of particles that may become dislodged from the chamber body 102 (for example, due to flaking of deposited films or attack of the chamber body 102 from the plasma) and redeposited upon the surface of the substrate 112, thereby improving product quality and yield.

Figure 1B:
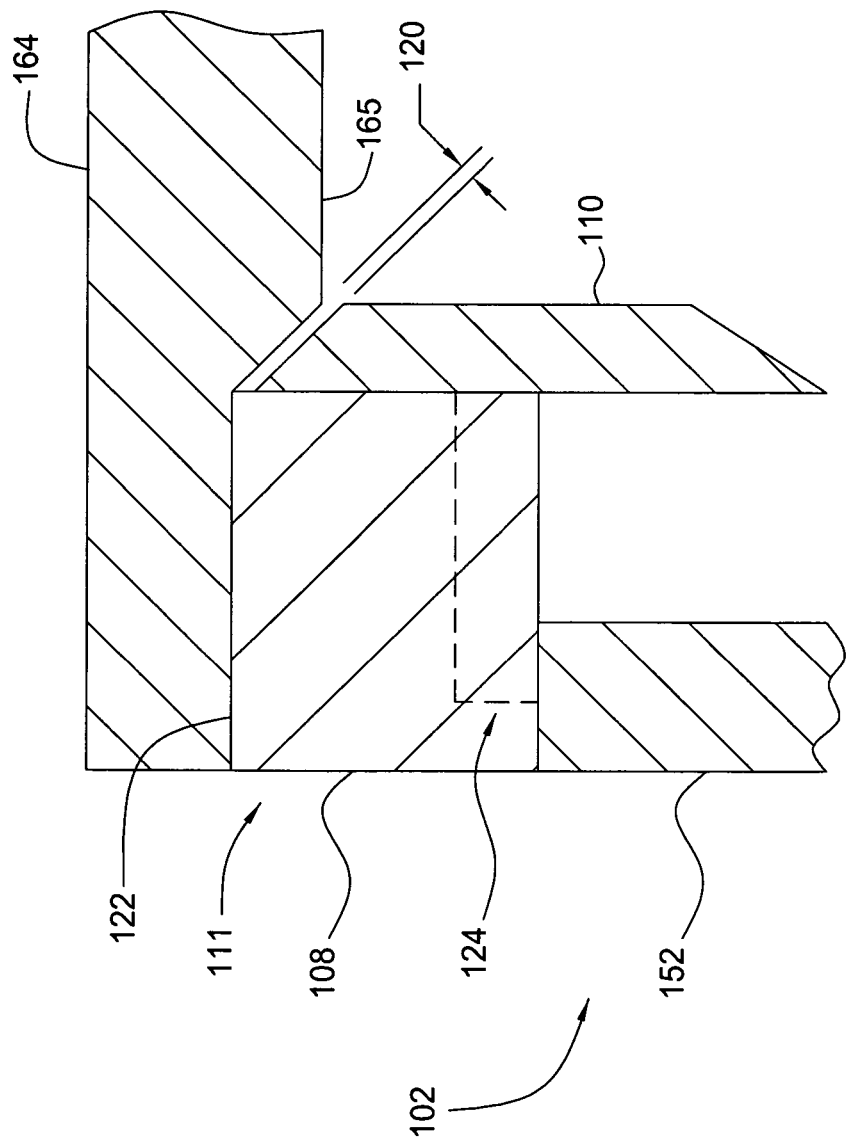
FIG. 1B is a schematic detail of the interface between the ground shield, target, and chamber body of a PVD chamber.

FIG. 1B depicts a schematic detail of the interface between the ground frame 108 and the ground shield 110 of the ground shield assembly 111, the target 164, and the chamber body 152. The ground frame 108 is generally coupled to the target 164. Alternatively, the ground frame 108 may be coupled to a backing plate (not shown), or other component, of the lid assembly 106 so long as the ground shield 110 may be positioned and adjusted as necessary with respect to the target 164. The ground frame 108 generally insulates the ground shield 110 from the target 164. In one embodiment, the ground frame 108 has an insulative interface 122 with the target 164.

The ground frame 108 also provides a conductive path 124 from the ground shield 110 to the chamber body 102. In one embodiment, the ground frame 108 has a conductive path 124 to the sidewall 152 of the body 102. The conductive path 124 may comprise a conductive wire, lead, strap, and the like coupled between the ground shield 110 and the body 102. Alternatively, the ground frame 108 may have a lower portion comprised of a suitable electrically conductive material to provide the conductive path 124 between the ground shield 110 and the body 102.

The ground shield 110 is coupled to the ground frame 108 in a suitable manner for adjusting and maintaining a gap 120 between the central portion 165 of the target 164 and the ground shield 110. For example, the ground shield 110 may be coupled to the ground frame 108 by screws, bolts, clamps, and the like. The ground shield 110 may further have an oversized hole, slot, or similar feature formed therein for facilitating the adjustment of the gap 120. It is contemplated that other mechanisms may be used for adjusting and aligning the gap 120 between the central portion 165 of the target 164 and the ground shield 110.

The gap 120 is generally uniform in depth and along its length, i.e., the opposing faces of the target 164 and the ground shield 110 that form the gap are generally parallel. As such, an upper edge of the ground shield 110 is generally formed to be parallel with the mating face of a protruding edge of the central portion 165 of the target 164. It should be noted that the angles of the respective edges of the ground shield 110 and the target 164 depicted in FIG. 1A (vertical or 90 degrees) and FIG. 1B (about 45 degrees) are for illustrative purposes only, and any other suitable angle may be used as well. In addition, the ground shield 110 may have means for adjusting the width of the gap 120 along its length as well. Suitable means for adjusting may include set screws, adjustment screws, cams, shims, spacers, and the like. Alternatively or in combination, the ground shield 110 may comprise multiple sections that may be independently adjusted with respect to the target 164, as discussed further below. The gap 120 may generally be any width wide enough to prevent arcing between the target 164 and the ground shield 110 and narrow enough to maintain the dark space of the plasma between the target 164 and the ground shield 110, e.g., to prevent the glow discharge of the plasma from moving into the gap 120.

Figure 2:
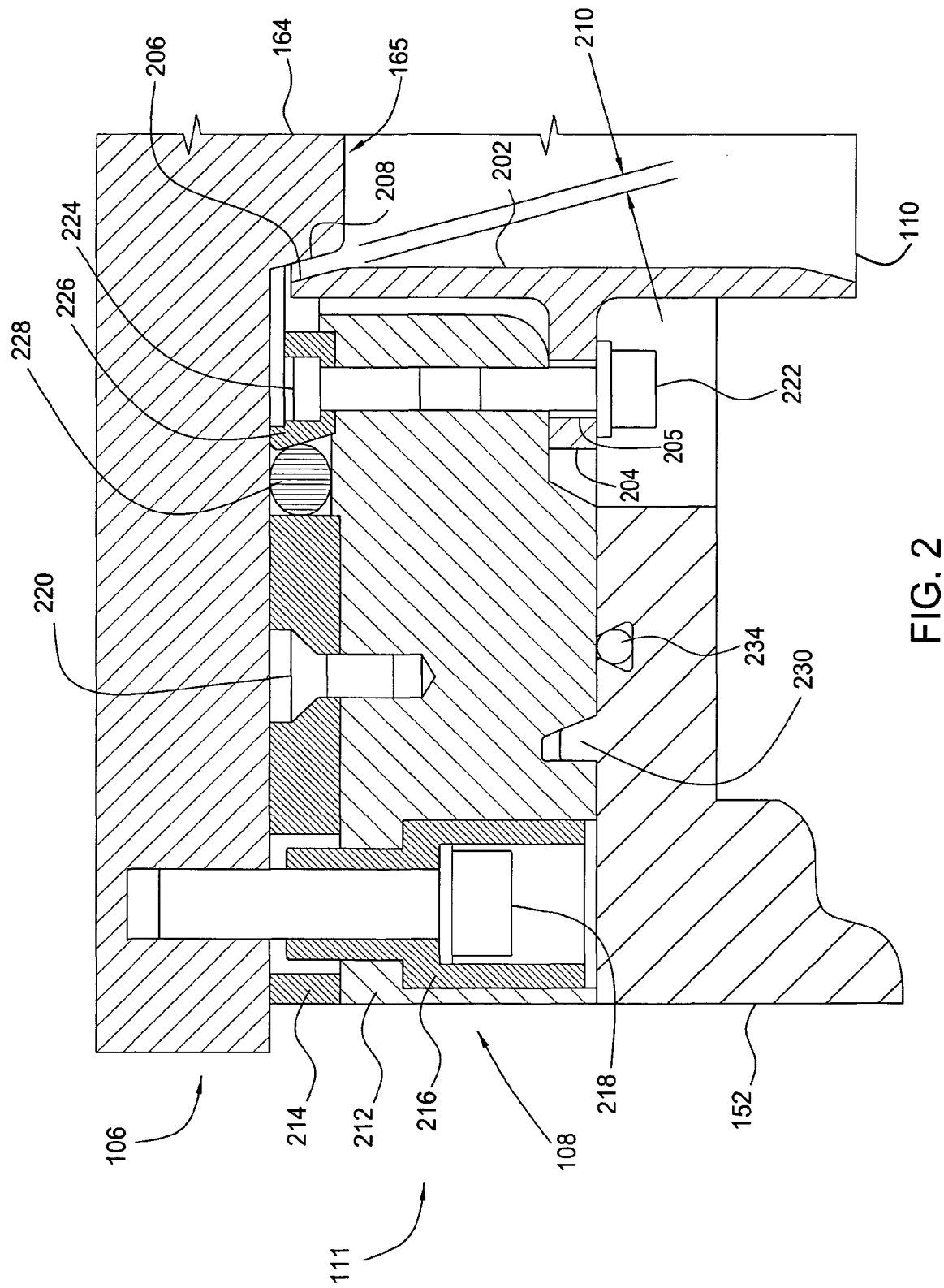
FIG. 2 is a sectional view of another embodiment of a ground shield.

FIG. 2 depicts a sectional side view of one embodiment of the ground shield 110 and the ground frame 108 of the ground shield assembly 111. The ground shield 110 may be fabricated from any conductive material that has suitable mechanical and electrical properties, vacuum characteristics, and is compatible with the manufacturing processes. For example, the ground shield 110 may be fabricated from a conductive material such as stainless steel, aluminum, and the like. Alternatively, the ground shield 110 may be comprised of a non-conductive material that is coated with a suitable conductive material as described above.

In one embodiment, the ground shield 110 comprises a wall 202 that is held in such a manner as to maintain a small gap 210 between an upper edge 206 of the wall 202 and a protruding edge 208 of the central portion 165 of the target 164. The upper edge 206 of the wall 202 is formed or held such that the gap 210 is substantially uniform and parallel between the edge 206 of the wall 202 and the protruding edge 208 of the target 164. The angle of the upper edge 206 depicted in FIG. 2 is illustrative only. It is contemplated that any angle may be used as required to be substantially parallel to the protruding edge 208 of the target 164.

The wall 202 may be of varying length and is at least long enough to be held flush with the central portion 165 of the target 164. In embodiments where the wall 202 extends past the central portion 165 of the target 164, the wall 202 may be held substantially perpendicularly to the target 164 or at an angle to the target 164. For example, in the embodiment depicted in FIG. 2, the wall 202 is held substantially perpendicular to the target 164. Alternatively, the wall 202 may be angled either towards or away from the center of the chamber 100.

The ground shield 110 is held in position relative to the target 164 by the ground frame 108. The ground shield 110 may be coupled to the ground frame 108 in any suitable manner. In one embodiment, a flange 204 extends from the wall 202 of the ground shield 110. The flange 204 has a hole 205 formed therethrough to facilitate coupling to the ground frame 108 by a screw 222. In order to facilitate maintaining the gap 210, the hole 205 may be oversized or formed as a slot to allow for alignment of the ground shield 110 with respect to the target 164 prior to tightening the screw 222. It is contemplated that other mechanisms for alignment and adjustment may be utilized alternatively or in combination. For example, set screws, adjustment bolts, cams, shims, spacers, and the like may also be used alone or in combination to provide proper alignment and spacing of the gap 210.

Furthermore, alternatively or in combination with other embodiments disclosed herein, the ground shield 110 may further comprise multiple segments, modules, or pieces that facilitate local alignment of gap 210 along the perimeter of the interface between the upper edge 206 of the ground shield 110 and the edge 206 of the target. This advantageously allows for compensation for tolerances and imprecision of the components of the lid assembly and/or their installation.

Figure 3:
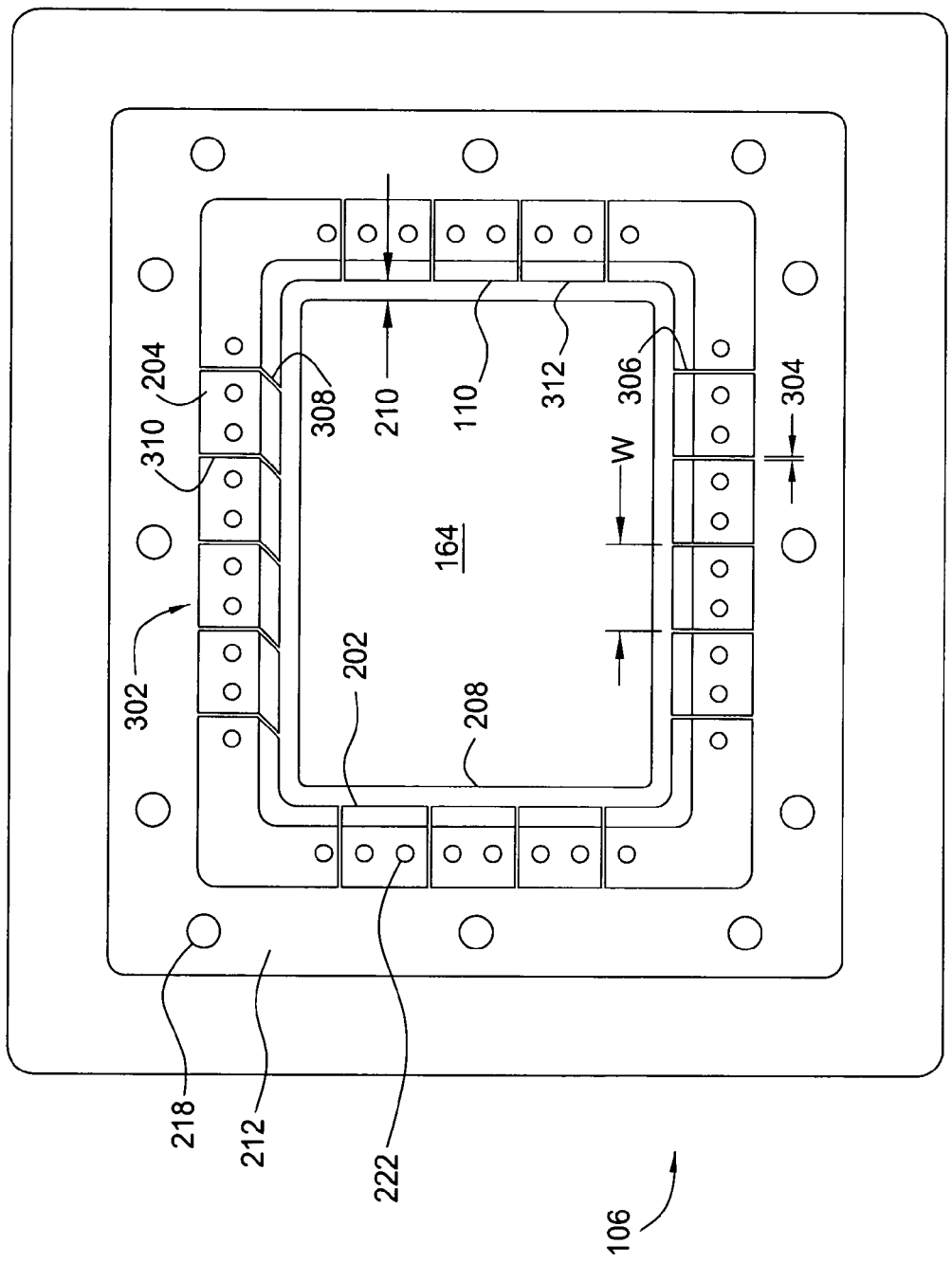
FIG. 3 is a bottom view of the ground shield of FIG. 2.

For example, FIG. 3 depicts a bottom view of the ground shield 110 of FIG. 2 attached to the lid assembly 106. In the embodiment depicted in FIG. 3, the ground shield 110 comprises a plurality of sections 302 that are arranged to circumscribe the target 164. Each of the sections 302 are coupled to the conductive frame 212 via screws 222. The plurality of sections 302 allow for the gap 210 to be locally maintained (i.e., maintained in the region proximate the particular section 302 of the ground frame 110).

The sections 302 may abut each other or, alternatively, a small gap 304 may exist between each of the sections 306. The gap 304 should be narrow enough to prevent the glow discharge of the plasma from entering the gap 304. The gap 304 allows for a degree of independent angular adjustment of each sections 302 to further more precisely maintain the gap 210 between the wall 202 of each section and the protruding edge 208 of the target 164. The sides of the wall 202 of each section 302 may be either straight or angled. For example, a side 306 of the wall 202 is straight, i.e., aligned with a side 310 of the flange 204, or substantially perpendicular to a face 312 of the wall 202. Alternatively, a side 308 of the wall is angled, i.e., not aligned (non-parallel) with the side 310 of the flange 204, or non-perpendicular to the face 312 of the wall 202. The angle of the side 308 may be any angle sufficient to prevent a "line of sight" through the gap 304, e.g., the side 308 may be non-perpendicular to the face 312 of the wall 202. The side 310 of the flange 204 may also be non-perpendicular to the face 312 of the wall 202. For example, the side 308 and the side 310 may be formed at the same angle. In the embodiment depicted in FIG. 3 the angle of the edge 308 is about 45 degrees.

Each of the sections 302 has a width W that may be selected as desired for a particular application. For example the width W of the sections 302 may be larger if fewer components are desired, or if the tolerance of the target and the sections 302 are known to be more precise. Alternatively, the width W may be smaller if more sections 302 are desired. The width W may also be selected based upon the size of the target 164. For example, the width W of the sections 302 may be selected to balance the overall number of sections required due to the size of the target 164 and a desired flexibility of alignment controlled by width W the of the sections 302.

The sections 302 also allow for the ground frame 110 to be part of a modular system that may be utilized with targets of varying sizes, thereby reducing the number and cost of parts required to operate chambers having targets of varying size. It is further contemplated that not all of the sections 302 need to have the same width W. For example, special sections may be made for the corner regions of angular targets or multiple width sections may be utilized to obtain greater flexibility in the arrangement of the sections 302 or their use with multiple targets of differing sizes. It is further contemplated that, although the embodiments depicted herein show a rectangular target 164, the ground shield 110, and sections 302 may be made in any desired shape, for example, polygonal or curved, as required to match the shape of the target being used and to maintain the small gap around the periphery of the selected target.

Returning to FIG. 2, in one embodiment, the ground frame 108 provides the ground path between the ground shield 110 and the grounded chamber wall 152 while insulating the ground shield 110 from the target 164 by comprising an electrically conductive frame 212 and an isolator plate 214. The conductive frame 212 may be coupled directly to the ground shield 110, for example, by the screw 222. The conductive portions of the ground frame 108, e.g., the conductive frame 212, may be fabricated from the same conductive materials as the ground shield 110.

The isolator plate 214 is disposed between the electrically conductive frame 212 and the target 164 of the lid assembly 106. The isolator plate 214 is made of an electrically non-conductive material and serves to electrically separate the conductive frame 212 from the target 164. The isolator plate 214 may be held in place by any suitable process-compatible means. In the embodiment depicted in FIG. 2, the isolator plate 214 is fastened to the conductive frame 212 by a plurality of screws (one screw 220 shown). The isolator plate 214 may be fabricated from any process-compatible materials having suitable mechanical, electrical, and vacuum properties. For example, the isolator plate 214 may be fabricated from polyether ether ketone (PEEK), polyvinyl chloride (PVC), polytetrafluoroethylene (PTFE), glass reinforced plastic (e.g., G10), acetal homopolymer (DELRIN®), and the like.

The ground frame 108 is configured to support the ground shield 110 in place and is affixed to the target 164 in any suitable process-compatible manner. In the embodiment depicted in FIG. 2, a screw 218 is utilized to fasten the ground frame 108 to the target 164. An insulating collar 216 may be used in embodiments where the screw 218 is a conductive material in order to maintain the electrical isolation of the target 164 from the conductive frame 212. The insulating collar 216 may be fabricated from the same materials as the isolator plate 214. In the embodiment depicted in FIGS. 2-3, the ground frame 108 is an assembly that circumscribes the target. However, it is contemplated that the ground frame 108 may have alternate configurations suitable for securely holding the ground shield 110 in place relative to the target 164 once installed.

The lid assembly 106, with the ground frame 108 and ground shield 110 attached, is disposed on the wall 152 of the chamber 102. The direct contact between the conductive frame 212 and the grounded chamber wall 152 provides an electrical ground path for the ground shield 110. The ground frame 108 may simply rest on the wall 152 of the chamber 102. Alternatively, a plurality of fasteners, such as bolts, clamps, and the like, may be utilized to secure the lid assembly 106 to the chamber wall 152. Optionally, one or more locating pins 230 or other mechanism may be utilized to facilitate the alignment and retention of the lid assembly 106 with respect to the wall 152 of the chamber 102.

The interface between the frame 108 and the wall 152 should be sufficiently tight to maintain a vacuum in the process volume 160 during processing. Optionally, a seal may be disposed between the wall 152 and the conductive frame 212 to ensure that no air leakage occurs along the interface between the wall 152 and the conductive frame 212. The seal may comprise a gasket, an o-ring, or other suitable mechanism known in the art. In the embodiment depicted in FIG. 2, a seal 234 is disposed between the wall 152 and the conductive frame 212 to form a seal therebetween. In addition, a seal may optionally be used to reduce leakage between the process volume 160 (depicted in FIG. 1A) and the atmosphere outside the process chamber 100 along the interface between the lid assembly 106 and the ground frame 108. In one embodiment, a seal 228 is disposed between the ground frame 108 and the target 164. The seal 228 may optionally be held in place by an non-conductive retainer 226 affixed to the conductive frame 212 by suitable means, such as a plurality of screws (one screw 224 shown in FIG. 2). The retainer 226 may be fabricated from the same materials as the isolator plate 214. Alternatively, seals may be respectively disposed in grooves formed along the interfaces between the isolator plate 214 and the target 164, and the isolator plate 214 and the ground frame 212 without the need for the retainer 226.

Returning to FIG. 1A, typically, a controller 190 interfaces with and controls the process chamber 100. The controller 190 typically comprises a central processing unit (CPU) 194, support circuits 196 and memory 192. The CPU 194 may be one of any form of computer processor that can be used in an industrial setting for controlling various chambers and sub-processors. The memory 192 is coupled to the CPU 194. The memory 192, or computer-readable medium, may be one or more of readily available memory such as random access memory (RAM), read only memory (ROM), floppy disk, hard disk, or any other form of digital storage, local or remote. The support circuits 196 are coupled to the CPU 194 for supporting the processor in a conventional manner. These circuits include cache, power supplies, clock circuits, input/output circuitry, subsystems, and the like. The controller 190 may be used to control operation of the process chamber 100, including any deposition processes performed therein.

Thus an improved ground shield is provided herein. The ground shield is coupled directly to the lid assembly, thereby advantageously facilitating accurate alignment of the ground shield with the target. In addition, the need to adjust the gap between the ground shield and the target after the lid is installed is eliminated, as the gap may be set prior to placing the lid assembly on the chamber. Furthermore, the ground shield may comprise segments that allow for more precise alignment of the gap along the periphery of the target. Moreover, the need for costly precision-machined locating pins and/or parts, as required in conventional chambers that do not have adjustable target/ground shield arrangements, is also eliminated.

While the foregoing is directed to embodiments of the present invention, other and further embodiments of the invention may be devised without departing from the basic scope thereof, and the scope thereof is determined by the claims that follow.

The invention claimed is:

1. Apparatus for processing a substrate disposed in a physical vapor deposition chamber having a target disposed in a lid assembly and a grounded chamber wall comprising:
   a ground frame configured to be insulatively coupled to the lid assembly, the ground frame having an electrically conductive lower surface; and
   a ground shield having an electrically conductive wall adjustably and electrically coupled to the conductive lower surface of the ground frame, the ground shield having a plurality of segments independently adjustable with respect to the ground frame, the ground shield configured to circumscribe the target and having an upper edge disposed proximate and substantially parallel to a protruding edge of the target to form a gap therebetween which is narrow enough to prevent the glow discharge of a plasma from entering the gap when installed, wherein the direction of the gap is substantially perpendicular to or at an angle to the target, and the ground shield is substantially perpendicular to a surface of the target facing the substrate or at an angle either towards or away from a central axis of the chamber.

2. The apparatus of claim 1, wherein the ground frame further comprises: an isolator plate forming an insulative upper surface of the ground frame.

3. The apparatus of claim 2, wherein the isolator plate comprises at least one of acetal homopolymer, polyether ether ketone, polytetrafluoroethylene, polyvinyl chloride, or glass reinforce plastic.

4. The apparatus of claim 2, wherein the ground frame further comprises: a conductive frame disposed below the isolator plate.

5. The apparatus of claim 4, wherein the conductive frame comprises at least one of stainless steel or aluminum.

6. The apparatus of claim 1, wherein the ground frame is configured to provide a substantially airtight seal between an interior volume disposed within the chamber and an atmosphere disposed outside of the chamber when installed between the lid assembly and the chamber wall.

7. The apparatus of claim 1, wherein the plurality of segments facilitates alignment of the gap along a perimeter of an interface between the upper edge of the ground shield and the protruding edge of the target.

8. The apparatus of claim 7, wherein a side of the electrically conductive wall of each of the plurality of segments is substantially perpendicular to or non-perpendicular to a face of the electrically conductive wall.

9. The apparatus of claim 1, wherein the ground shield comprises at least one of stainless steel or aluminum.

10. Apparatus for processing a substrate comprising:
a chamber having a chamber body and a lid assembly;
a target coupled to the lid assembly;
a ground frame coupled to the lid assembly and electrically insulated from the target, the ground frame having an electrically conductive path to the body; and
an electrically conductive ground shield having an electrically conductive wall adjustably and electrically coupled to the ground frame, the ground shield having a plurality of segments independently adjustable with respect to the ground frame, and a side of the electrically conductive wall of each of the plurality of segments is substantially perpendicular to or non-perpendicular to a face of the electrically conductive wall, wherein the ground shield circumscribes the target and has an upper edge disposed proximate and substantially parallel to a protruding edge of the target to form a gap therebetween which is narrow enough to prevent the glow discharge of a plasma from entering the gap when installed, the gap allows for a degree of independent angular adjustment of each segments and the direction of the gap is substantially perpendicular to or at an angle to the target, and wherein the face of the electrically conductive wall of the ground shield is substantially perpendicular to a surface of the target facing the substrate or at an angle either towards or away from a central axis of the chamber.

11. The apparatus of claim 10, wherein the ground frame further comprises:
an isolator plate disposed between the ground frame and the target.

12. The apparatus of claim 11, wherein the isolator plate comprises at least one of acetal homopolymer, polyether ether ketone, polytetrafluoroethylene, polyvinyl chloride, or glass reinforced plastic.

13. The apparatus of claim 10, wherein the ground frame further comprises:
an isolator plate coupled to the lid assembly; and
a conductive frame having an upper surface coupled to the isolator plate and a lower surface coupled to the chamber body.

14. The apparatus of claim 13, wherein the conductive frame comprises at least one of stainless steel or aluminum.

15. The apparatus of claim 13, wherein the ground shield is coupled to the conductive frame.

16. The apparatus of claim 10 further comprising:
a seal disposed between the ground frame and the lid assembly.

17. The apparatus of claim 10 further comprising: a seal disposed between the ground frame and the chamber body.

18. The apparatus of claim 10 further comprising:
a flange extending from the electrically conductive wall of each of the plurality of segments in a direction radially outwards from the central axis of the chamber, wherein the flange is adjustably coupled to the ground frame.

19. The apparatus of claim 10, wherein the ground shield comprises at least one of stainless steel or aluminum.

20. The apparatus of claim 10, wherein the angle of the side of the electrically conductive wall of each of the plurality of segments is about 45 degrees to the face of the electrically conductive wall.

21. The apparatus of claim 10, wherein the angle of the side of the electrically conductive wall of each of the plurality of segments is about 45 degrees to the face of the electrically conductive wall.

22. The apparatus of claim 18, wherein the flange has a hole formed therethrough to facilitate coupling to the ground frame by a screw.

23. The apparatus of claim 22, wherein the hole is oversized to allow for alignment of the ground shield with respect to the target prior to tightening the screw.

* * * * *